United States Patent [19]

Ueda et al.

[11] Patent Number: 5,173,625
[45] Date of Patent: Dec. 22, 1992

[54] METHOD AND APPARATUS FOR CONVERSION OF SIGNAL LEVEL FROM ECL TO TTL

[75] Inventors: Masahiro Ueda; Toshiaki Hanibuchi; Katsushi Asahina, all of Hyogo, Japan

[73] Assignee: Mitsubishi Denki Kabushiki Kaisha, Tokyo, Japan

[21] Appl. No.: 744,578

[22] Filed: Aug. 14, 1991

[30] Foreign Application Priority Data

Aug. 22, 1990 [JP] Japan .................................. 2-222074

[51] Int. Cl.$^5$ ............................................. H03K 19/00
[52] U.S. Cl. ................................... 307/475; 307/455; 307/456
[58] Field of Search ............... 307/443, 455, 456, 467, 307/475

[56] References Cited

U.S. PATENT DOCUMENTS

| | | | |
|---|---|---|---|
| 3,766,406 | 10/1973 | Bryant et al. | 307/475 |
| 3,986,045 | 10/1976 | Lutz | 307/475 |
| 4,368,395 | 1/1983 | Taylor | 307/475 |
| 4,629,913 | 12/1986 | Lechner | 307/475 |
| 4,644,194 | 2/1987 | Birrittella et al. | 307/475 |
| 4,678,944 | 7/1987 | Williams | 307/475 |
| 4,998,029 | 3/1991 | Sundstrom | 307/475 |
| 5,081,376 | 1/1992 | Nitta et al. | 307/475 |

FOREIGN PATENT DOCUMENTS 3441142 2/1990 Fed. Rep. of Germany .

OTHER PUBLICATIONS

NTT LSI Laboratories Publication by Suzuki et al. entitled "ECL to TTL, TTL to ECL Transistor IC", p. C-2-94.

Primary Examiner—Robert J. Pascal
Attorney, Agent, or Firm—Lowe, Price, LeBlanc & Becker

[57] ABSTRACT

A level conversion apparatus for converting a signal of an ECL level into a signal of a TTL level is disclosed which has source voltages set to a potential corresponding to a lower limit logic swing of the ECL level and a potential corresponding to an upper limit logic swing of the TTL level. This level conversion apparatus includes a reference voltage generating circuit for generating an upper limit reference voltage and a lower limit reference voltage divided from a voltage applied between a source terminal Vcc and a ground terminal, a control signal generating circuit for generating a control signal in response to the ECL level signal, determined by a difference between the upper limit reference voltage and the lower limit reference voltage, and an output switching circuit for carrying out a switching operation in response to the controlled signal. The output switching circuit outputs a signal determined by the potential corresponding to the upper limit logic swing of the TTL level and a ground source.

19 Claims, 11 Drawing Sheets

METHOD AND APPARATUS FOR CONVERSION OF SIGNAL LEVEL FROM ECL TO TTL

BACKGROUND OF THE INVENTION

1. Technical Field

This invention relates to an improvement in a level conversion apparatus connected between a logic circuit of a first standard having a predetermined logic swing and a logic circuit of a second standard having a logic swing greater than that of the first standard, for converting a signal from the first standard logic circuit to the logic swing of a signal of the second standard, and more particularly to a level conversion apparatus enabling lowering of a source voltage level.

2. Description of the Background Art

The recent progress in semiconductor technology has led to development of logic integrated circuits of various standards ranging from relatively slow TTL (Transistor-Transistor Logic) to ECL (Emitter-Coupled Logic).

FIG. 10 is a block diagram showing an example of computer systems including TTL logic integrated circuits. Referring to this drawing, a bus line 1 has, connected thereto, a CPU 2, a main memory 3, a cache memory 4 and an input/output device 5 all formed of TTL elements, for example. External devices such as a printer 6 and a keyboard 7 are connected to the input/output device 5.

However, the CPU 2 and cache memory 4, for example, are sometimes replaced by a CPU 2' and a cache memory 4' formed of ECL elements to meet the need for high-speed processing. In this case, as shown in FIG. 11, level conversion apparatus 9 must be connected between the CPU 2' and bus line 1 and between the cache memory 4' and bus line 1, respectively. In other words, when using, in combination, ECL devices operable at a relatively high-speed and TTL devices which are relatively slow, it is necessary to match the levels of the two types of devices.

FIG. 12 is a block diagram showing an example where an ECL logic integrated circuit 8 and a TTL logic integrated circuit 10 are interconnected through a conventional level conversion apparatus 9. The ECL integrated circuit 8 is supplied with a source voltage VEE of −5.2 to −4.5 volts, and outputs a signal terminating at a resistor Rg of 50 ohms. This resistor Rg is supplied with a source voltage VTT of −2 volts. The ECL integrated circuit 8 has a high level (H) logic amplitude at −0.8 volts and a low level (L) logic amplitude at −1.6 volts. On the other hand, a source voltage VTL of +5 volts is connected to the TTL integrated circuit 10. The TTL integrated circuit 10 has a high level logic amplitude at 2.4 volts or more and a low level logic amplitude at 0.4 volts or less.

The level conversion apparatus 9 is supplied with the two source voltages VTL and VEE of +5 volts and −5 volts, and converts the ECL levels (H=−0.8 V, L=−1.6 V) into the TTL levels (H>2.4 V, L<0.4 V).

FIG. 13A is a block diagram of the above mentioned conventional level conversion apparatus 9. Referring to the figure this apparatus includes an input switching circuit A, a reference voltage generating circuit B, a control signal generating circuit E and output switching circuit C. The reference voltage generating circuit B receives the supply voltage $V_{EE}$ (−5 V) and generates reference voltages Vbb and Vcs. The reference voltages $V_{bb}$ and $V_{cs}$ are applied to the input switching circuit A.

The input switching circuit A is connected between the supply voltage $V_{EE}$ and the control signal generating circuit E, and it carries out switching operation upon reception of a signal $V_{in}$ from an ECL integrated circuit. More specifically, if the potential of the signal $V_{in}$ is higher than the potential of the reference voltage $V_{bb}$, it turns on, and if the potential of the signal $V_{in}$ is lower than the potential of the reference voltage $V_{bb}$, it turns off. The reference voltage $V_{cs}$ determines the amount of the current flowing to input switching circuit A when the input switching circuit A turns on.

The control signal generating circuit E generates a control signal for turning off the output switching circuit C in response to the switch-on signal from the input switching circuit A, and a control signal for turning on the output switching circuit C in response to a switch-off signal from the input switching circuit A.

The output switching circuit C is connected between the supply voltage $V_{cc}$ (5 V) and the ground potential and switches in response to two control signals from the control signal generating circuit E, and generates a signal $V_{out}$ of the TTL level.

FIG. 13B is a circuit diagram illustrating one example of the conventional level conversion apparatus 9. This apparatus is described in MELL INTEGRATED CIRCUITS DATA BOOK, 1971, published by Motorola. Referring to FIG. 13B, this level conversion circuit includes an ECL input terminal Vi, a TTL output terminal Vo, a source terminal Vcc supplied with 5 V, a source terminal VEE supplied with −5 V, and a ground terminal GND. Transistors Q21, Q22 and Q23 and a resistor R25 constitute an input switching circuit A. Transistors Q27 and Q28, diodes D27 and D25, and resistors R26, R27, R28 and R29 constitute a reference voltage generating circuit B which supplies voltages Vbb and Vcs to the input switching circuit A. The voltage Vbb is a reference voltage for determining a threshold level for input, and is set to a potential (−1.2 V) approximately midway between the high level and low level logic amplitudes of the ECL. The voltage Vcs is a reference voltage for determining a current level for the input switching circuit A, and is applied to the base of transistor Q23. Resistors R21 and R24 provide load resistances of the input switching circuit A, which are supplied to a totem pole type output circuit C composed of transistors Q25 and Q26 and a diode D23. A transistor Q24, resistors R22 and R23, and diodes D21 and 22 constitute a voltage clamping circuit D for regulating an upper limit of the voltage generated from the load resistor R24 of the input switching circuit A. The clamping circuit D, and resistors R21 and R24 constitute the control signal generating circuit E.

An operation of the level conversion apparatus shown in FIG. 13B will be described next.

Assume first that the ECL input terminal Vi is applied with high level (H=−0.8 V). Since the high-level signal (−0.8 V) applied to the input terminal Vi has a higher potential than Vbb, the transistor Q21 included in the input switching circuit A becomes conductive and the transistor Q22 becomes nonconductive. With the transistor Q21 becoming conductive, voltage is generated at opposite ends of the load resistor R21, thereby sufficiently lowering the base potential of the transistor Q25 of the output circuit C. The transistor Q25 becomes nonconductive in response to the lowering of this base voltage.

On the other hand, no current flows through the resistor R24 since the transistor Q22 is nonconductive. Consequently, the clamped voltage generated by the voltage clamping circuit D is applied to the transistor Q26 of the output circuit C, to render the transistor Q26 conductive. With the transistor Q26 becoming conductive, the output terminal Vo and ground terminal GND of the output circuit C are interconnected to output approximately 0 V (low level).

Assume next that the ECL input terminal Vi is applied with low level (L= −1.6 V). In response to the low level input, the transistor Q21 becomes nonconductive and the transistor Q22 conductive. With the transistor Q21 becoming nonconductive, no current flows through the input switching circuit A. Consequently, the base of the transistor Q25 of the output circuit C has a potential corresponding approximately to that of the source terminal Vcc, thereby rendering the transistor Q25 conductive. On the other hand, since the transistor Q22 is conductive, current flows from the input switching circuit A to the resistor R24, thereby sufficiently lowering the base potential of the transistor Q26 of the output circuit C. The transistor Q26 becomes nonconductive in response to the lowering of this base voltage. As a result, a high level signal is output from the output terminal Vo of the output circuit C. This high-level signal has a potential Vcc−2 Vbe, where Vbe is a forward voltage of the transistor Q25 or diode D23, whose value is about 0.8 V. If a load resistor is connected between the output terminal Vo and ground terminal GND, the output voltage will be about 3.4 V. If this is a capacitive load such as a capacitor, a potential on the order of 5 V will be output.

The conventional ECL-TTL level conversion circuit as constructed above has the drawback of large power consumption since the relatively high voltages of +5 V and about −5 V are used as source voltages for application to the level conversion circuit.

The source voltages may be lowered to eliminate the drawback of power consumption. However, since the totem pole type output circuit is used in the conventional circuit, at least 3 volts must be applied as the source voltage to the source terminal Vcc. The potential supplied to the source terminal VEE must be −3 V or less to generate the threshold voltage Vbb for the input switching circuit A and the threshold voltage Vcs for determining the current level.

FIG. 14 is a block diagram showing level conversion apparatus receiving data of plural bits. Referring to the figure, this level converting apparatus is different from the level converting apparatus of FIG. 13A in that a plurality of input switching circuits A, control signal generating circuits E and output switching circuits C are provided corresponding to the plurality of bits. More specifically, in order to receive a plurality of bit signals from the ECL logic integrated circuit, only the reference voltage generating circuit B may be used commonly, while the other circuits A, C and E must be provided in the number corresponding to the number of bits. However, each of the other circuits A, C and E includes a large number of elements and, if the number of such circuits is increased to correspond to the number of bits, the circuit construction will become complicated and require an enlarged substrate area.

SUMMARY OF THE INVENTION

An object of this invention, therefore, is to provide a level conversion apparatus connected between a logic integrated circuit of a first standard having a small logic swing and a logic integrated circuit of a second standard having a large logic swing, which level conversion apparatus is capable of level conversion with lower source voltages than in the prior art.

Another object of this invention is to reduce power consumption by the level conversion apparatus.

A further object of this invention is to reduce the number of circuit elements, thereby to simplify the construction of the level conversion apparatus to which a plurality of bit signals are input, and to reduce the required substrate area.

In short, a level conversion circuit according to this invention converts a signal of an ECL level into a signal of a TTL level, and includes a source terminal Vtt set to a potential corresponding to a lower limit logic swing of the ECL level, a source terminal Vcc set to a potential corresponding to an upper limit logic swing of the TTL level, and a ground terminal. The level conversion apparatus further includes a reference voltage generating device, an input switching device, a differential voltage generating device, an amplifier device, and an output switching device. The reference voltage generating device is connected between the source terminal Vcc and ground terminal for generating an upper limit reference voltage correlated with the logic swing of the TTL level and a lower limit reference voltage correlated with the logic swing of the ECL level. The input switching device is connected to the source terminal Vtt and reference voltage generating device for carrying out a switching operation in response to the ECL level signal. The differential voltage generating device is connected between the upper limit reference voltage and lower limit reference voltage of the reference voltage generating device. The differential voltage generating device is operable in response to the switching operation of the input switching device for generating a voltage corresponding to a difference between the upper limit reference voltage and lower limit reference voltage. The amplifier device amplifies the differential voltage. The output switching device carries out a switching operation in response to a signal from the amplifier device, and outputs a signal of a logic swing, determined by the source terminal Vcc and ground potential.

In operation, the level conversion device receives a source voltage determined by amplitudes of the source terminal Vtt and source terminal Vcc since the source terminal Vtt is set to a potential corresponding to the lower limit logic swing of the ECL level and the source terminal to a potential corresponding to the upper limit logic swing of the TTL level. In converting the ECL level to the TTL level, for example, the source voltage may have an amplitude determined by the lower logic swing −1.6 V of the ECL level and the upper logic swing 2.4 V of the TTL level.

Consequently, this level conversion apparatus is operable with lower source voltages than the conventional level conversion apparatus, which provides the advantage of reduced power consumption.

DESCRIPTION OF THE PREFERRED EMBODIMENTS

Figure 2:
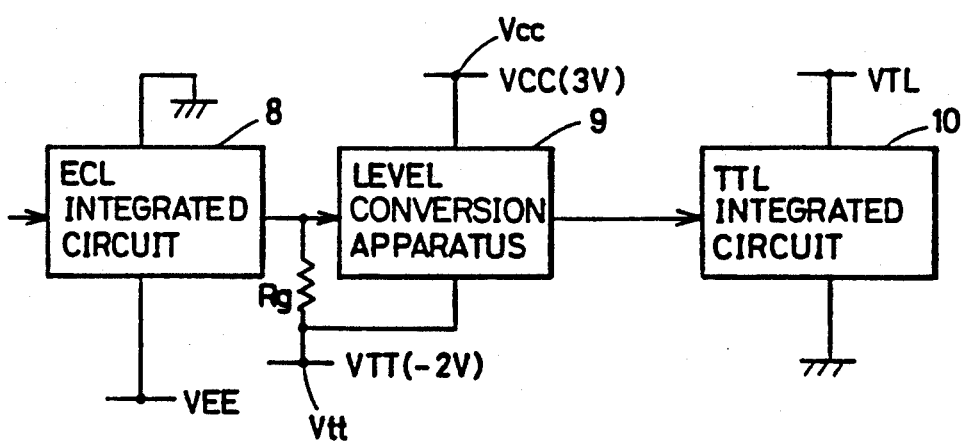
FIG. 2 is a block diagram showing a level conversion apparatus, of this invention connected between an ECL logic integrated circuit and a TTL logic integrated circuit.

FIG. 2 is a block diagram showing a level conversion circuit of this invention connected between an ECL integrated circuit and a TTL integrated circuit. Like references are affixed to like components with respect to FIG. 12. Referring to FIG. 2, the ECL integrated circuit 8 is connected to a −5 V power source, and its output is connected to a terminal source VTT of −2 V through a matching resistor Rg between the ECL integrated circuit 8 and level conversion apparatus 9. The level conversion circuit 9 is connected to the source voltage VTT and to a power source VCC of +3 V. The TTL integrated circuit 10 is connected to a power source VTL of +5 V.

Figure 12:
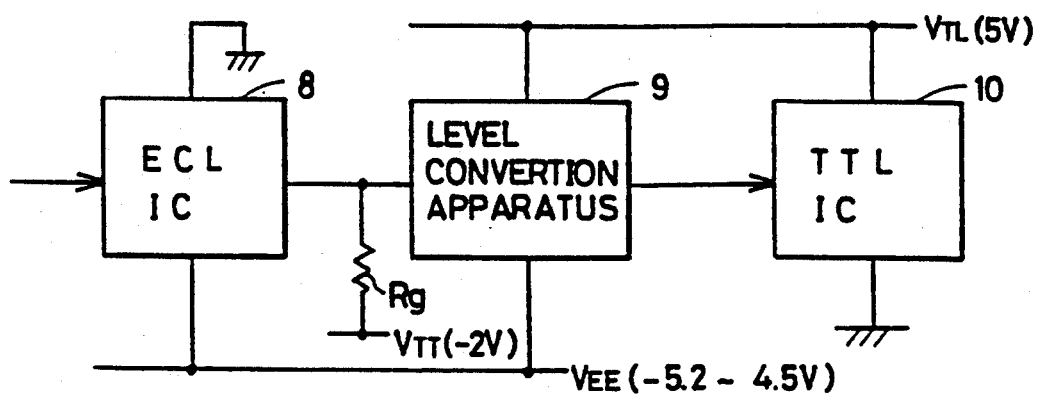
FIG. 12 is a block diagram showing a conventional level conversion circuit connected between an ECL logic integrated circuit and a TTL logic integrated circuit.

As distinct from the level conversion apparatus shown in FIG. 12, the level conversion circuit 9 in this embodiment has +3 V supplied to a source terminal Vcc, and −2 V supplied to a source terminal Vtt. In this way, power consumption may be reduced by utilizing lower source voltages than in the prior art. Further, by using the terminal voltage VTT of −2 V as the minus side voltage, there is no need to provide an additional source voltage.

Figure 1:
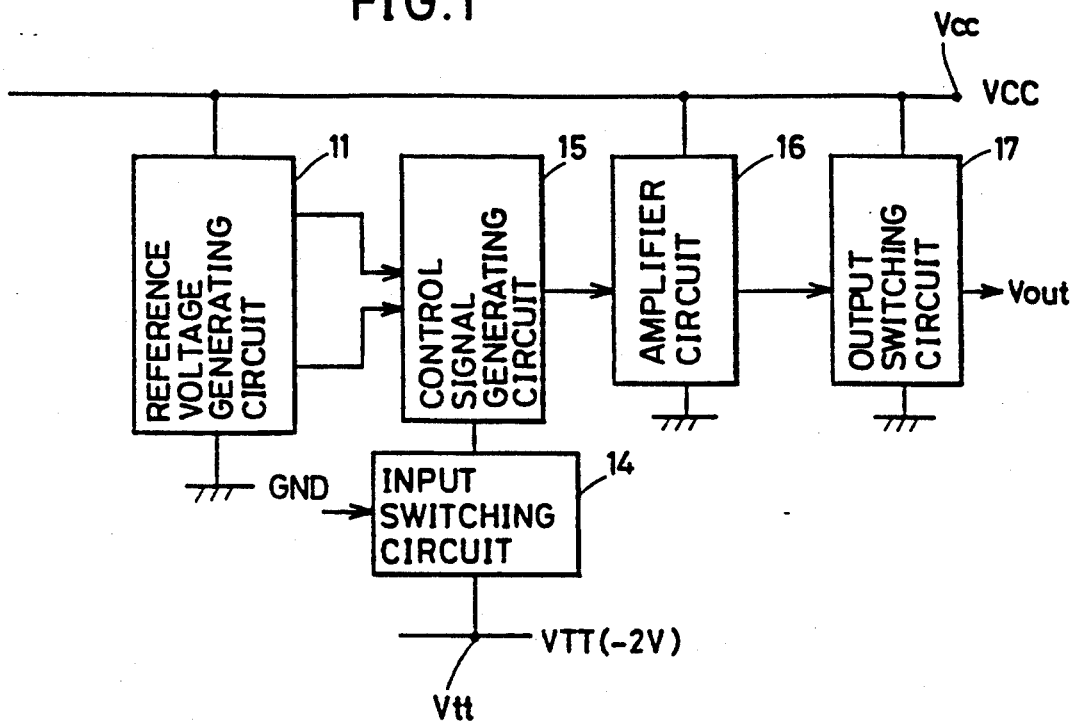
FIG. 1 is a block diagram showing an embodiment of this invention.

FIG. 1 is a block diagram showing a level conversion apparatus in one embodiment of this invention. Referring to this drawing, the level conversion apparatus 9 in this embodiment includes the source terminal Vcc supplied with the source voltage of +3 V, the source terminal Vtt supplied with the source voltage of −2 V, a reference voltage generating circuit 11 connected between the source terminal Vcc and a ground source GND for generating a reference voltage correlated with an upper limit of a TTL level and a reference voltage correlated with a lower limit of the TTL level, an input switching circuit 14 for carrying out a switching operation in response to an input signal Vi from the ECL logic integrated circuit 8, a differential voltage generating circuit 15 operable in response to the switching operation of the input switching circuit 14 for generating a differential voltage between the upper limit reference voltage and lower limit reference voltage, an amplifier circuit 16 for amplifying a differential voltage signal generated by the differential voltage generating circuit 15, and an output switching circuit 17 operable in response to an output signal of the amplifier circuit 16 for carrying out a switching operation to output a signal of a logic amplitude determined by the source voltage Vcc and ground source GND.

Figure 3:
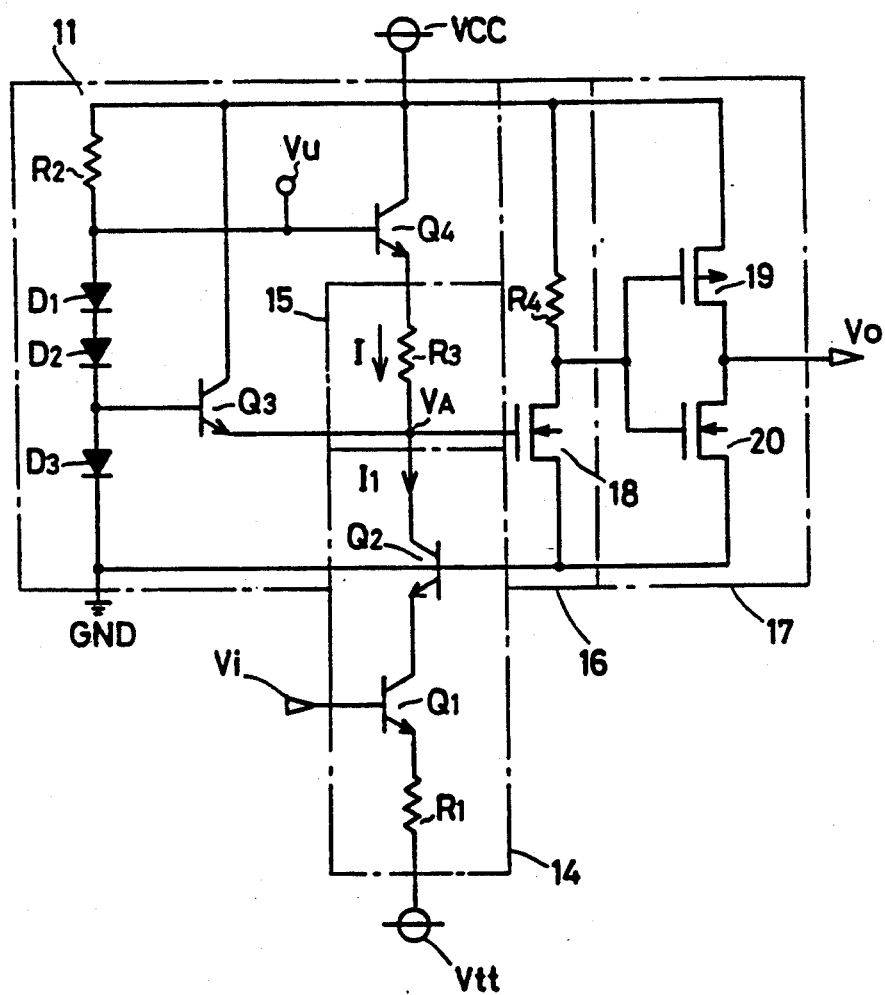
FIG. 3 is a circuit diagram showing details of FIG. 1.
Figure 4:
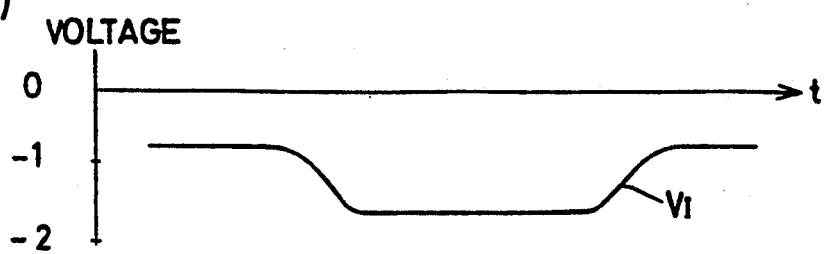
FIGS. 4(1)–4(4) are views showing voltage waveforms of circuits shown in FIG. 3.
Figure 4:
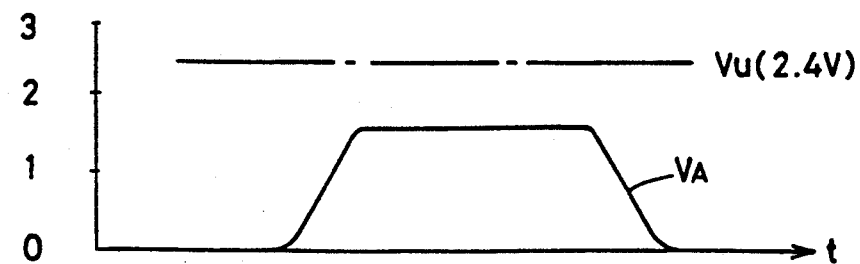
Figure 4:
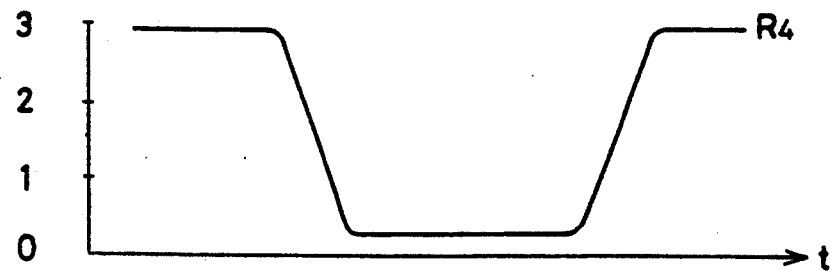
Figure 4:
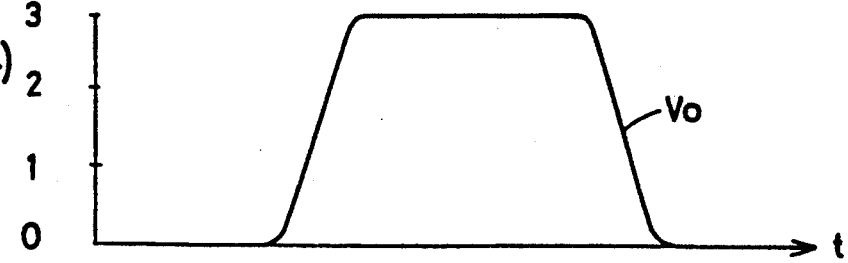

FIG. 3 shows a specific construction of the level conversion circuit shown in FIG. 1, and FIG. 4 shows signal waveforms of the respective parts of the circuit. Referring to FIG. 3, the input switching circuit 14 includes transistors Q1 and Q2 and a resistor R1. The reference voltage generating circuit 11 includes a resistor R2, diodes D1, D2 and D3, and transistors Q3 and Q4. The resistor R2 and diodes D1, D2 and D3 are used for generating a reference voltage of 2.4 V, while the diode D3 is used for preventing the low level of voltage generated by the differential voltage generating circuit 15 or the resistor R3 from becoming excessively low. A voltage Vu generated by the resistor R2 and diodes D1, D2 and D3 is applied to the transistor Q4, while a voltage (0.8 V) generated by the diode D3 is applied to the transistor Q3. The transistors Q3 and Q4 clamp voltages generated at opposite ends of the resistor R3. The amplifier circuit 16 includes an N-channel MOSFET 18 and a resistor R4. The output switching circuit 17 includes a CMOS inverter with a P-channel MOSFET 19 and an N-channel MOSFET 20 in complementary connection.

FIG. 4 is a view of output waveforms of the respective circuits shown in the circuit diagram of FIG. 3. In FIG. 4, (1) is the waveform of a signal applied to the input switching circuit 14, and (2) is the waveform of a voltage applied to the gate of the N-channel MOSFET 18. Reference (3) shows the waveform of the drain of the N-channel MOSFET. Reference (4) is the waveform of an output Vo of the output switching circuit 17.

An operation of the level conversion circuit shown in FIGS. 1 through 4 will be described now. Assume first that high level (H = −0.8) is applied to the ECL input terminal Vi. The transistor Q1 becomes conductive since the H = −0.8 V applied to the input terminal Vi is higher than the potential of the source terminal Vtt and the voltage between base and emitter is forward. With this transistor becoming conductive, current I flows to the load resistor R3 (differential voltage generating circuit) through the transistor Q2 with a grounded base, thereby lowering the voltage for the resistor R3. Voltage VA applied to the gate of the amplifier circuit 16 at this time is expressed by the following equations:

$$VA = (Vu - Vbe(Q4)) - I1 \times (R3) \quad (1)$$

$$VA = (Vu - Vbe(Q4)) - Vbe(D1) - Vbe(D2) \quad (2)$$

$$Vu = Vbe(D1) + Vbe(D2) + Vbe(D3) \quad (3)$$

$$I = (Vi - Vbe(Q1) - VTT) / (R1) \quad (4)$$

where Vbe(Q4) and Vbe(Q1) are voltage drops in the forward direction of the transistors Q4 and Q1, and Vbe(D1), Vbe(D2) and Vbe(D3) are voltage drops in the forward direction of the diodes D1, D2 and D3.

The equation (1) above shows the case where Ix(R3) is smaller than a sum 2 Vbe of forward voltages of the diodes D1 and D2, and the equation (2) where Ix(R3) is equal to or greater than 2 Vbe. Thus, by setting the value of resistor R3 so that Ix(R3)=2 Vbe, the gate voltage VA of the amplifier circuit 16 may be 0 V when high level is input to the ECL input terminal Vi. In response to this 0 V, the N-channel MOSFET 18 of the amplifier circuit 16 becomes nonconductive. In response to the N-channel MOSFET 18 becoming nonconductive, the N-channel MOSFET 20 of the output switching circuit 17 becomes conductive and the P-channel MOSFET 19 nonconductive. As a result, approximately 0 V (low level) is output to the output terminal Vo of the output switching circuit 17.

Next, it is assumed that the ECL input terminal Vi receives L=−1.6 V (low level transistor Q1 becomes nonconductive since the potential difference between the base of the transistor Q1 and the source terminal Vtt is about 0.4 V and the voltage between base and emitter is lower than the forward voltage (0.8 V). As a result, hardly any current flows to the resistor R1 and no voltage drop occurs with the resistor R3. The gate voltage VA of the N-channel MOSFET 18 of the amplifier circuit 16 is then about 1.6 V which is the value of the voltage Vu−Vbe(Q4) generated by the transistor Q4 of the reference voltage generating circuit 11. This 1.6 V is amplified to an extent for readily allowing switching of the CMOS inverter of the output switching circuit 17. In this embodiment, the gate voltage VA is amplified to the source voltage VCC. Then, the voltage of H=VCC is output to the output terminal Vo by turning on the P-channel MOSFET 19 of the output switching circuit 17 and turning off the N-channel MOSFET 20.

Figure 5:
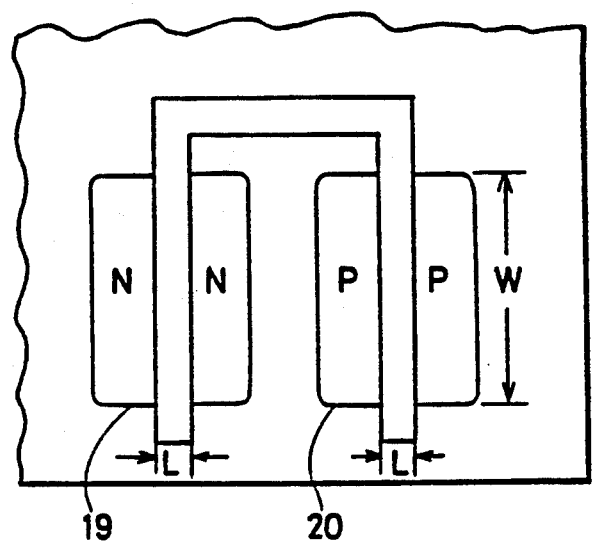
FIG. 5 is a plan view showing the construction of an output switching circuit.
Figure 6:
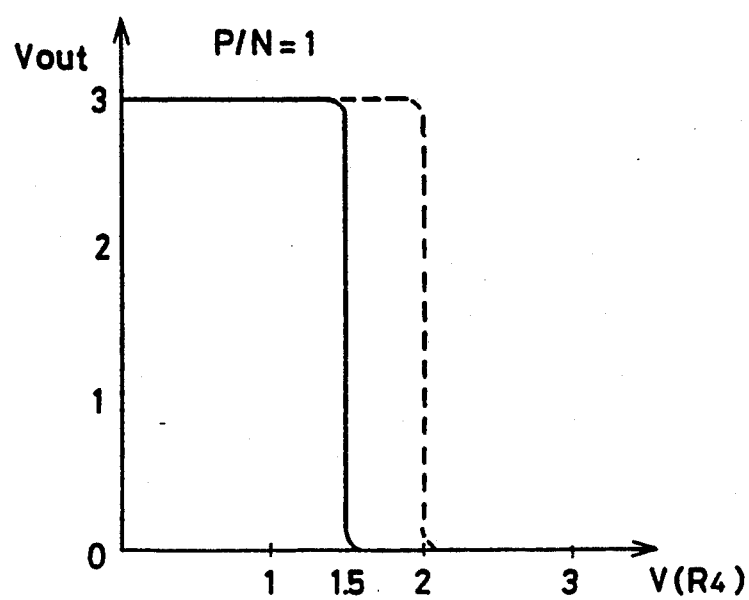
FIG. 6 is a view showing characteristics of the output switching circuit.
Figure 9:
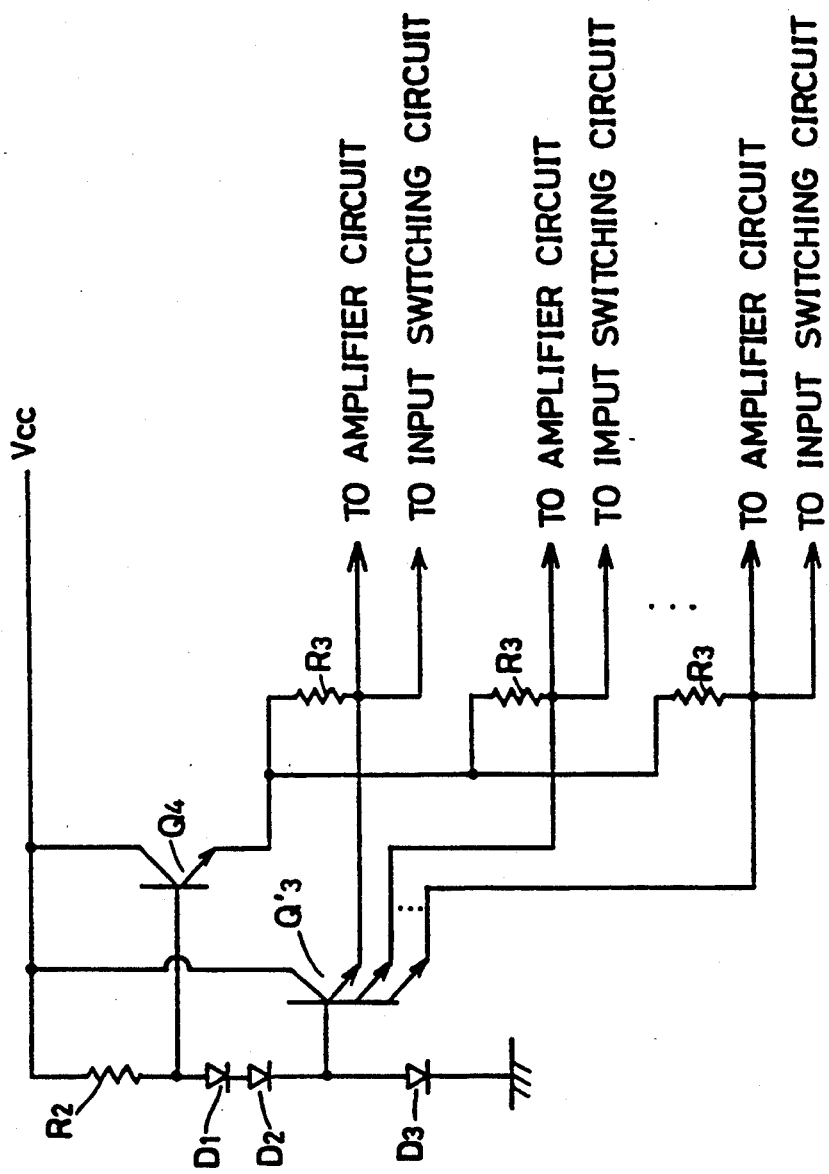
FIG. 9 is a circuit diagram showing a principal portion of FIG. 8.
Figure 10:
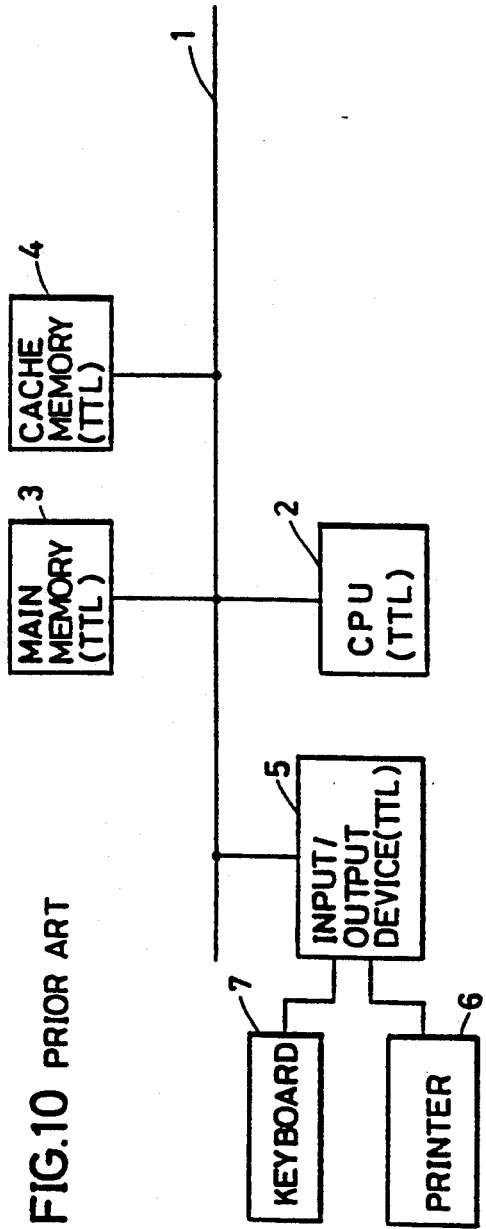
FIG. 10 is a block diagram of a computer system including TTL logic integrated circuits.
Figure 11:
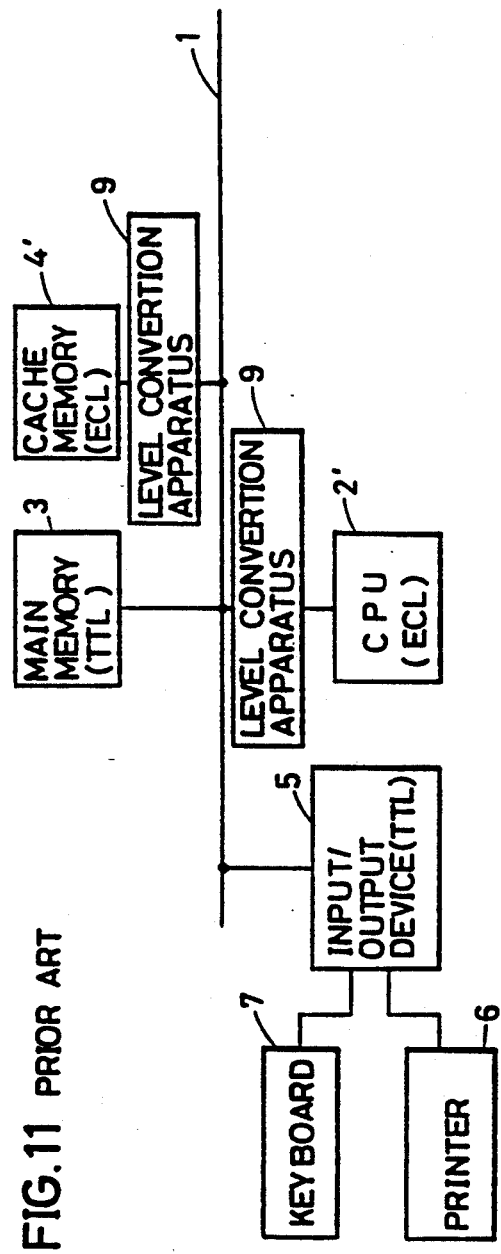
FIG. 11 is a block diagram showing an example where a CPU and a cache memory shown in FIG. 10 are formed of ECL logic integrated circuits.
Figure 13B:
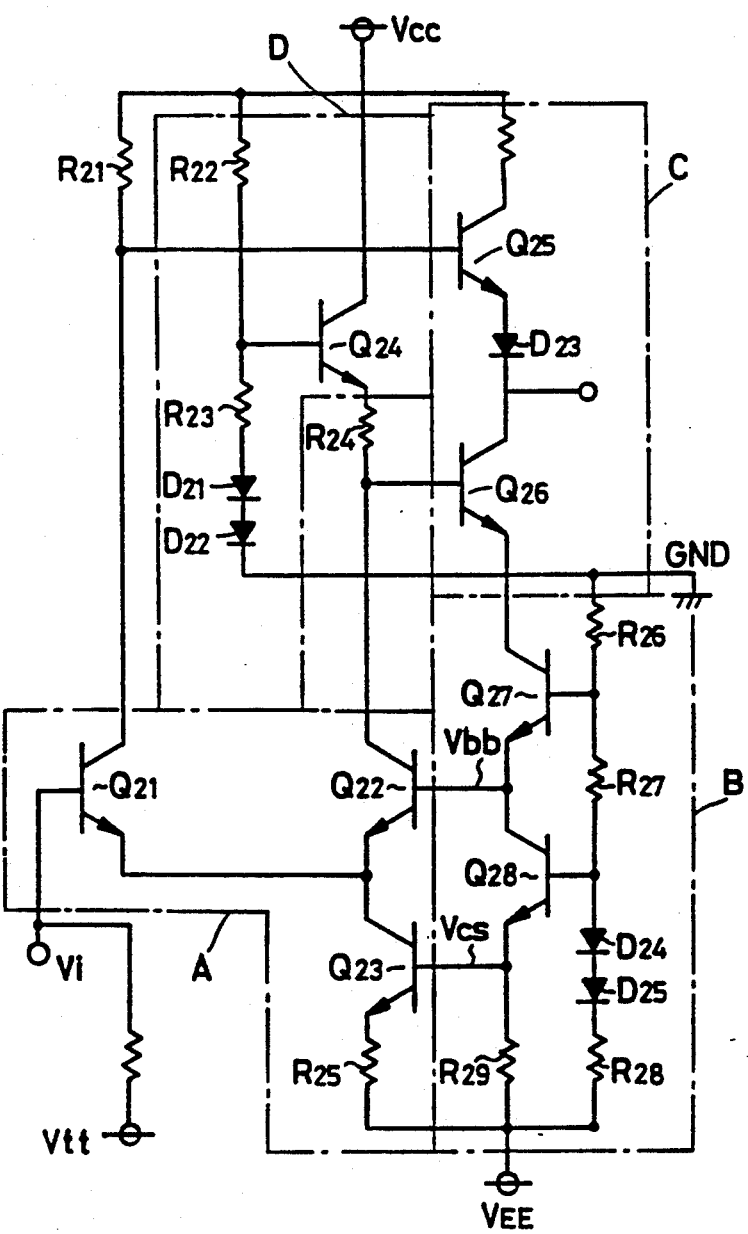
FIG. 13B is a circuit diagram of the conventional level conversion circuit shown in FIG. 12.

FIG. 5 is a plan view showing the construction of the output switching circuit 17, and FIG. 9 is a view showing characteristics of the output switching circuit 17. In FIG. 5, the MOSFETs 19 and 20 of the output switching circuit 17 have approximately the same driving power with the respective gates having a length L and a width W. It is therefore possible, as shown in FIG. 6, to set a threshold voltage of about 1.5 V for the voltage of 3 V supplied from the amplifier circuit 16. Since an appropriate threshold voltage may be set based on the gate width and gate length, the illustrated switching circuit 17 does not require the circuit required in the prior art for setting the threshold voltage Vbb and $V_{cs}$ as shown in FIG. 13B. Thus, this invention realizes simplified constructions of the output switching circuit and reference voltage generating circuit.

Figure 7A:
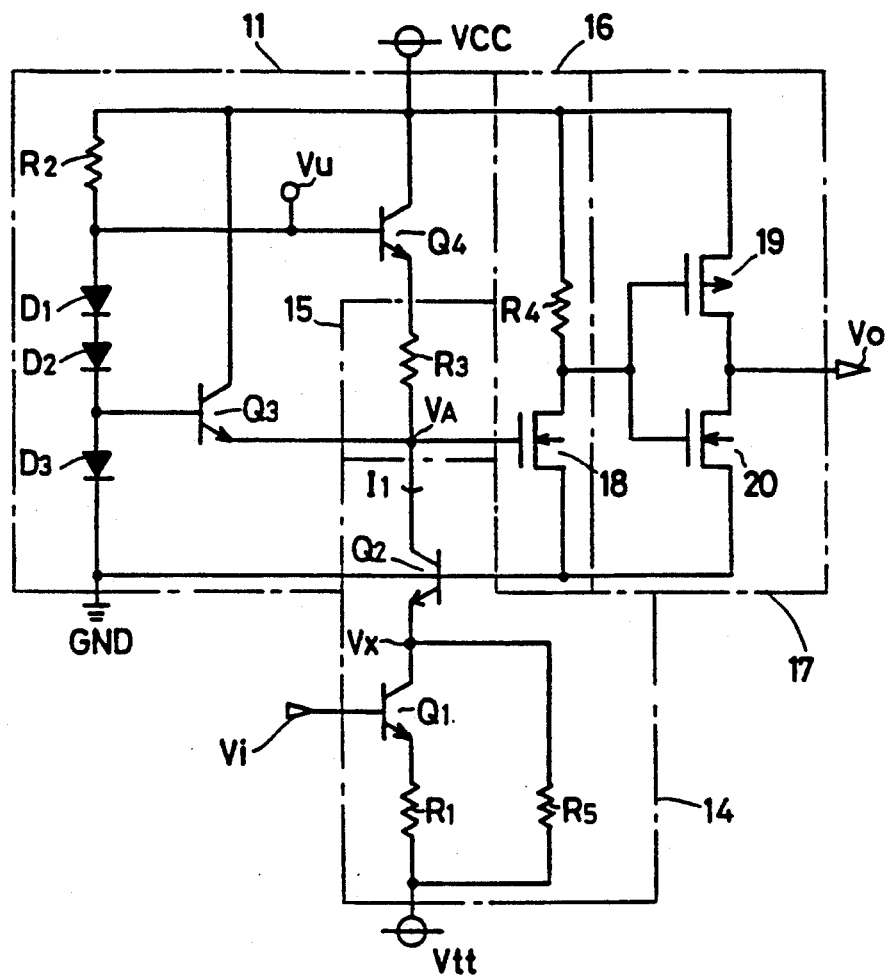
FIG. 7A is a circuit diagram showing a modification of FIG. 3.
Figure 7B:
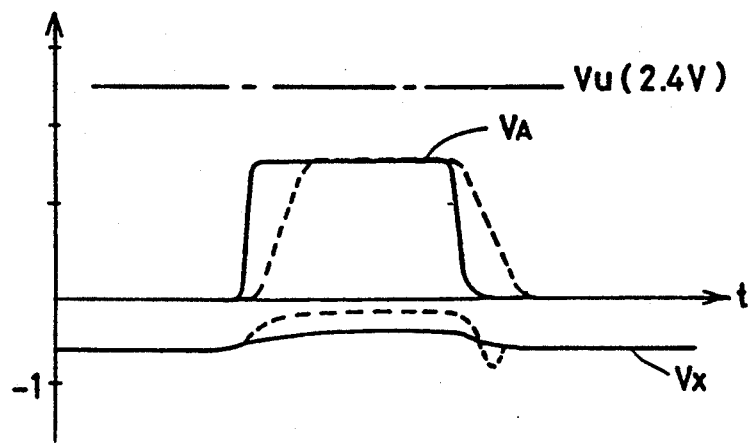
FIG. 7B is a diagram of waveforms of the control signal provided by the circuit of FIG. 7A.

FIG. 7A is a circuit diagram showing a modification made to the construction of FIG. 3. FIG. 7B shows improvements of rise and fall of the control signal. Referring to FIG. 7A, this level conversion apparatus differs from the apparatus of FIG. 3 only in that the resistor R5 is provided between the emitter (node $V_X$) of transistor Q2 and the power supply terminal $V_{tt}$. In the figure like references are affixed to like components with respect to FIG. 3 and description of such components will be omitted as appropriate. The dotted line in FIG. 7B shows waveforms of node $V_A$ and node $V_X$ when resistor R5 is not provided, while the solid line shows waveforms when R5 is provided. A resistor R5 is a biasing resistor for constantly maintaining the transistor Q2 in the conductive state. This is provided in order to avoid the possibility of switching delays which may occur when the transistor Q1 becomes nonconductive to stop the current flowing to the collector of the transistor Q2 thereby rendering the transistor Q2 nonconductive also. Since the resistor R5 is used for the biasing purpose, it is adequate for the resistor R5 to have a resistance about one order of magnitude grater than that of the resistor R3 and R1. This will result in little increase in power consumption.

More specifically, when the input signal $V_{in}$ attains to the H level, the transistor Q1 turns on, and therefore the potential of $V_A$ (see FIG. 4, (4)) falls to 0 V.

When the input signal $V_{in}$ attains to the L level, the transistor Q1 is turned off, and therefore the transistor Q2 tends to be changed to the cut off state, to raise the potential at node $V_X$. However, since the emitter of the transistor Q2 receives the supply voltage $V_{tt}$ through the resistor R5, the transistor is kept at the on state. The potential at node $V_X$ is kept substantially unchanged. Therefore, as shown by the solid line of FIG. 7B, rise and fall of the current at the node between the resistor R3 and the corrector of the transistor Q2 can be made faster.

Figure 8:
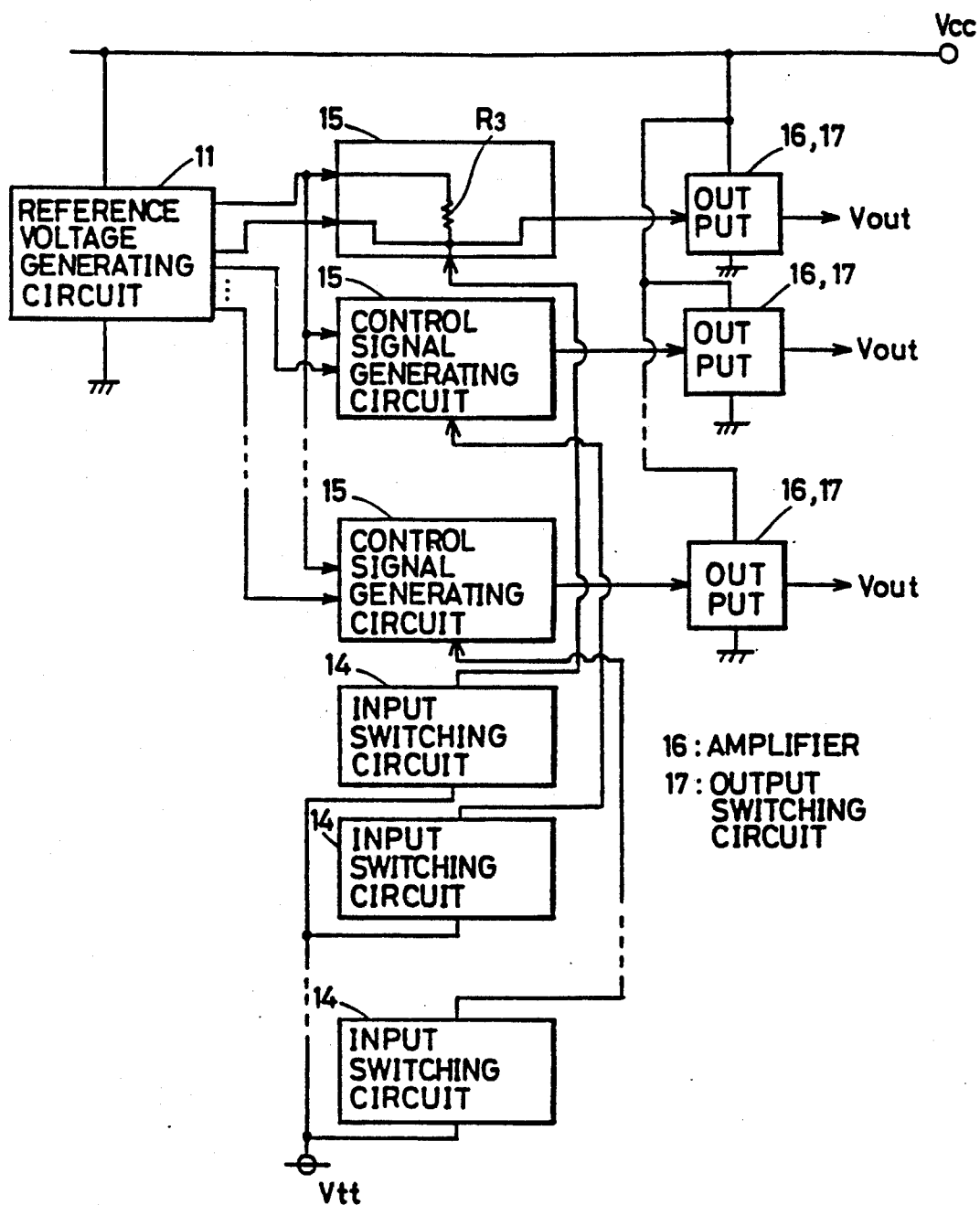
FIG. 8 is a block diagram showing a modification of FIG. 1.

FIG. 8 is a block diagram showing a modification made to the construction of FIG. 1, and FIG. 9 is a circuit diagram corresponding to a principal portion of FIG. 8. Referring to these drawings, like references are affixed to like components with respect to FIGS. 1 and 3 and description of such components will be omitted as appropriate. This embodiment includes a single reference voltage generating circuit 11, to which are connected differential voltage generating circuits 15, input switching circuits 14 and output switching circuits 17 each corresponding in number to signals input from the ECL logic integrated circuit. As shown in FIG. 9, the reference voltage generating circuit 11 has the transistor Q3 of one output (one emitter) replaced by a multi-emitter transistor Q3'.

The above construction is capable of effecting level conversion of a plurality of bit signals input from the ECL logic integrated circuit for supply to the TTL logic integrated circuit.

Figure 13A:
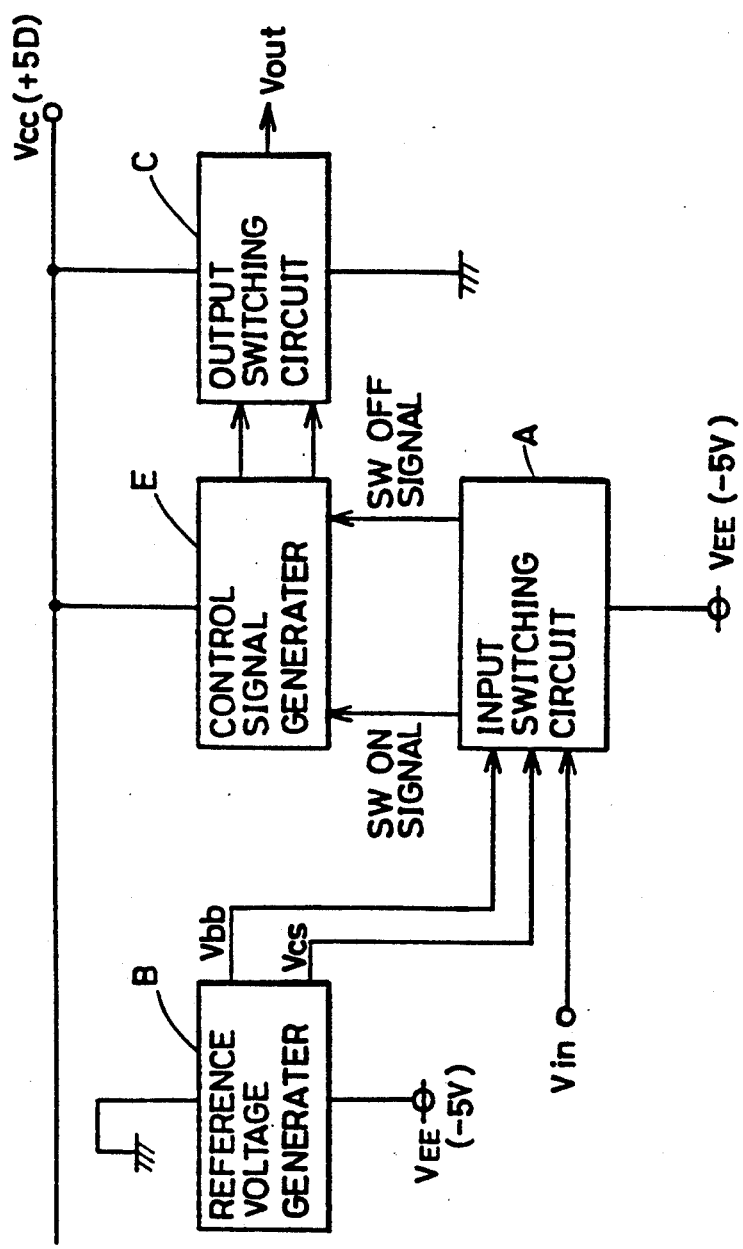
FIG. 13A is a block diagram of the prior art.
Figure 14:
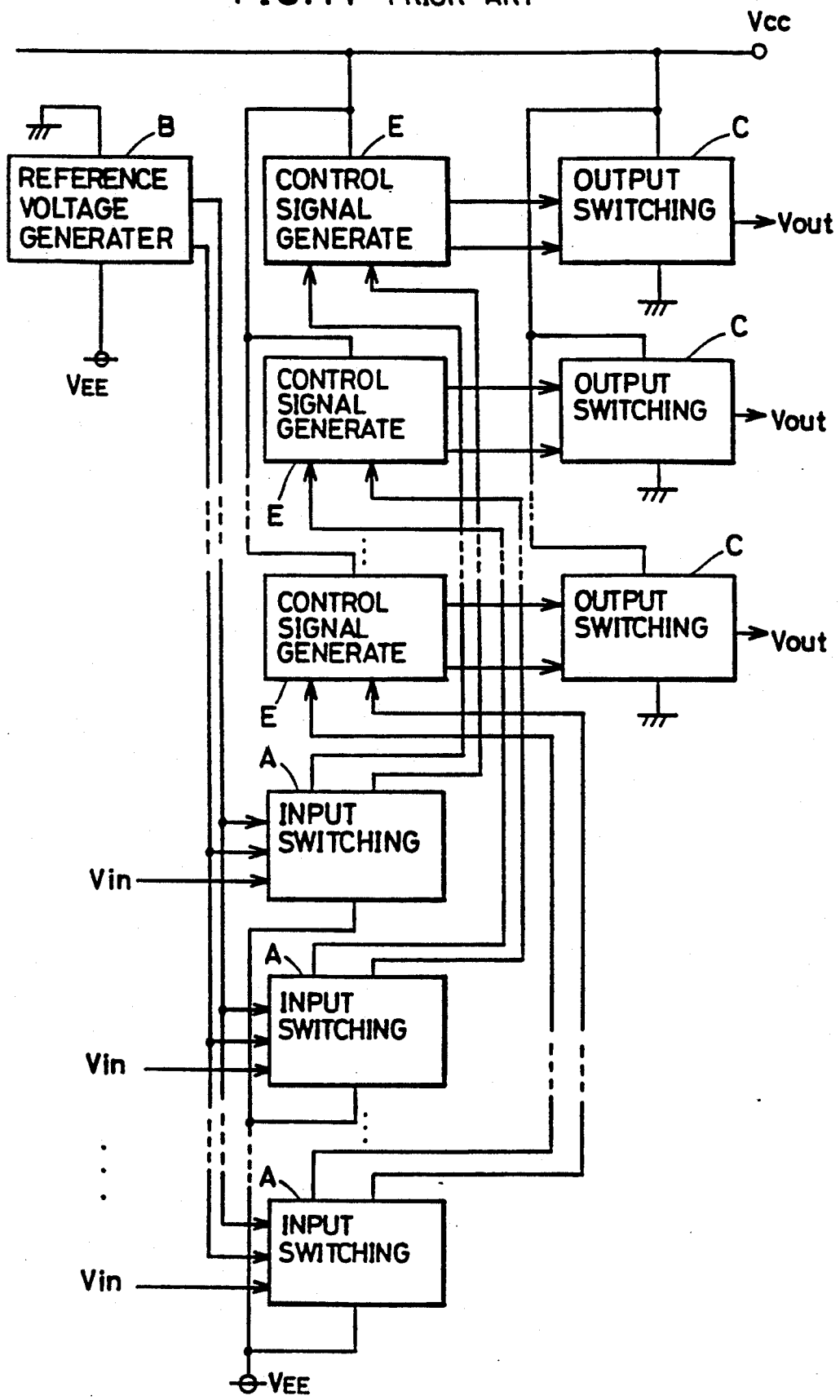
FIG. 14 is a block diagram showing modification of FIG. 13A.

Comparing this level conversion apparatus and the level conversion apparatus shown in FIG. 13, the conventional level conversion apparatus has only the reference voltage generating circuit B acting as a common circuit in receiving a plurality of bit signals, and requires the other circuits A, C and D and load resistors R21 and R22 to be provided in the number corresponding to the number of bit signals. In the level conversion apparatus shown in FIGS. 8 and 9, however, the transistors Q3' and Q4 corresponding to the clamping circuit D are made common, and moreover each circuit has a simple construction. This provides the advantage of reducing the area of the semiconductor integrated circuit.

What is claimed is:

1. Apparatus for converting a level of a signal from a first logic circuit having a first logic swing set to a rated voltage to a second logic swing of a signal of a second logic circuit set to a level higher than that of said first logic circuit, comprising:
   reference generator means for generating an upper limit reference voltage correlated with an upper limit of said second logic swing, and a lower limit reference voltage correlated with a lower limit of said second logic swing;
   means responsive to an input signal of said first logic swing for generating a difference voltage corresponding to a difference between said upper limit reference voltage and said lower limit reference voltage; and means for generating an output signal of a logic swing corresponding to said second logic swing.

2. A level conversion apparatus for converting signal level of ECL to TTL level, comprising:
reference voltage generating means for generating an upper limit reference voltage corresponding to an upper limit logic swing of said TTL level, and a lower limit reference voltage corresponding to lower limit logic swing of said TTL level;
means for generating a difference voltage corresponding to a difference between said upper limit reference voltage and said lower limit reference voltage, in response to said signal of ECL level; and
means for generating an output signal corresponding to the logic swing of said TTL level in response to said generated difference voltage.

3. A level conversion apparatus connected between a logic circuit of a first standard having a logic swing set to a rated voltage and a logic circuit of a second standard having a logic swing set to a higher level than the rated voltage of the first standard, for converting a level of a signal from the first standard logic circuit into the logic swing of a signal of the second standard, said level conversion apparatus comprising:
a first source terminal set to a potential between a lower limit logic swing of the logic circuit of said first standard and a predetermined voltage,
a second source terminal set to a potential corresponding to an upper limit logic swing of the logic circuit of said second standard,
a third source terminal set to a potential corresponding to the lower limit logic swing of the logic circuit of said second standard,
reference voltage generating means connected between said second source terminal and said third source terminal for generating an upper limit reference voltage correlated with an upper limit of the logic swing according to said second standard, and a lower limit reference voltage correlated with a lower limit of the logic swing according to said second standard,
control signal generating means connected to said first source terminal and said reference voltage generating means for generating a control signal in response to the signal from the logic circuit of said first standard, potential of said control signal being determined by the upper limit reference voltage and the lower limit reference voltage generated from said reference voltage generating means, and
outputting means operable in response to a control signal from said control signal generating means for carrying out a switching operation to generate an output signal of a logic swing determined by the potential of the second source terminal and the potential of the third source terminal.

4. A level conversion apparatus according to claim 3, wherein the logic circuit of said first standard includes an emitter-coupled logic circuit.

5. A level conversion apparatus according to claim 3, wherein the logic circuit of said second standard includes a transistor-transistor logic circuit.

6. A level conversion apparatus according to claim 3, wherein said predetermined voltage is a source voltage for terminating an emitter-coupled logic circuit, and the source voltage is supplied to a terminating register coupled to an output of the emitter coupled circuit.

7. A level conversion apparatus according to claim 3, wherein said reference voltage generating means includes:
a plurality of voltage dividing means connected in series between said second source terminal and said third source terminal, for dividing a voltage applied to said second and third source terminals into the upper limit reference voltage and the lower limit reference voltage, and
clamping means for clamping the upper limit reference voltage and the lower limit reference voltage to the potential of the control signal.

8. A level conversion apparatus according to claim 3, wherein said control signal generating means includes
voltage dropping means having an input terminal and an output terminal, said input terminal connected to the upper limit reference voltage and said output terminal connected to the lower limit reference voltage of said reference voltage generating means, and
input means connected between the output terminal of said voltage dropping means and to said first source terminal, for carrying out a switching operation in response to the signal from the logic circuit of said first standard.

9. A level conversion apparatus according to claim 8, wherein
said input means includes current controlling means for making constant a current flowing to an output terminal of said voltage lowering means, and
switching means switching in response to a signal from the logic circuit of said first standard for switching the current made constant by said current controlling means.

10. A level conversion circuit according to claim 9, wherein
said current controlling means includes a first transistor having a base connected to the third source terminal and a collector connected to the output terminal of said voltage lowering means, said switching means includes a second transistor having a collector connected to an emitter of said first transistor and a base connected to the signal from the logic circuit of said first standard, and resistance means connected between an emitter of said second transistor and said first source terminal.

11. A level conversion apparatus according to claim 10, wherein
said switching means includes resistance means connected between the collector of said second transistor and said first source terminal.

12. A level conversion apparatus according to claim 3, wherein
said output means includes
amplifying means for amplifying the control signal from said control signal generating means, and
switching means connected between said second source terminal and said third source terminal, switching in response to the control signal amplified by said amplifying means for outputting a signal having a logic swing of said second standard.

13. A level conversion apparatus according to claim 12, wherein
said amplifying means includes semiconductor control means having one control terminal and two conductive terminals, and resistance means connected between one of the conductive terminals of the semiconductor control means and said second source terminal, said control terminal being connected to an output of the control signal generating means, and the other conductive terminal being connected to said third source terminal.

14. A level conversion apparatus according to claim 12, wherein
said switching means includes complementary field effect transistor with a threshold voltage set in accordance with a driving power ratio between an N-channel FET and a P-channel FET.

15. A level conversion apparatus connected between a logic circuit of a first standard having a logic swing set to a rated voltage and a logic circuit of a second standard having a logic swing set to a higher level than the rated voltage of the first standard, for converting a signal of a plurality of bits from the first standard logic circuit into the logic swing of a signal of the second standard, said level conversion apparatus comprising:
a first source terminal set to a potential between a lower limit logic swing of the logic circuit of said first standard and a predetermined voltage,
a second source terminal set to a potential corresponding to an upper limit logic swing of the logic circuit of said second standard,
a third source terminal set to a potential corresponding to a lower limit logic swing of the logic circuit of said second standard,
reference voltage generating means connected between said second source terminal and said third source terminal for generating an upper limit reference voltage correlated with an upper limit of the logic amplitude according to said second standard, and a lower limit reference voltage correlated with a lower limit of the logic amplitude according to said second standard,
a plurality of control signal generating means provided corresponding to said plurality of bits, each connected between said first source terminal and said reference voltage generating means, responsive to corresponding one of the plurality of bits for generating a control signal whose potential is determined by said upper limit reference voltage and said lower limit reference voltage, and
a plurality of outputting means provided corresponding to said plurality of bits operable in response to a plurality of control signals from said control signal generating means, respectively, for carrying out switching operations to generate output signals of a logic amplitude determined by the potential of the second source terminal and the potential of the third source terminal.

16. A level conversion apparatus according to claim 15, wherein
said reference voltage generating means includes a multi-emitter transistor having a base connected to the lower limit reference voltage, a collector connected to the second source terminal, and a plurality of emitters connected to the control signal generating means.

17. A level conversion apparatus for converting signal level from ECL level to TTL level, comprising:
a first source terminal set to a potential between a lower limit logic swing of said ECL level and a predetermined potential;
a second source terminal set to a potential corresponding to upper logic swing of said TTL level;
a third source terminal set to the ground potential;
a plurality of voltage dividing means connected in series between said second source terminal and said third source terminal, for dividing a voltage applied between said second and third source terminals to set an upper reference voltage and a lower reference voltage corresponding to the upper and lower logic swings of said TTL level;
upper limit clumping means for clumping the set upper limit reference voltage;
lower limit clumping means for clumping the set lower limit reference voltage;
first resistor means having one end connected to receive the upper limit reference voltage clumped by said upper limit clumping means and the other end connected to receive the lower limit reference clumped by said lower limit clumping means;
input switching means connected between said first supply terminal and the other end of said first resistor means and switched in response to said ECL level signal for generating a control signal at the other end of said first resistor means,
said input switching means including,
a first transistor having its collector connected to the other end of said first resistor means and its base grounded,
a second transistor having its collector connected to the emitter of said first transistor, and its base connected to receive said ECL level signal, and
second resistor means connected between the emitter of said second transistor and said first supply terminal;
amplifying means for amplifying the control signal generated at the other end of said first resistor means;
a P channel MOS transistor having one conduction terminal connected to said second source terminal and its control terminal connected to receive the control signal amplified by the said amplifying means; and
an N channel MOS transistor having one conduction terminal commonly connected to the other conduction terminal of said P channel MOS transistor, the other conduction terminal connected to said second source terminal and its control terminal connected commonly to the control terminal of said P channel MOS transistor, wherein
said P channel MOS transistor and said N channel MOS transistor are switched complementarily in response to the control signal amplified by said amplifying means for generating a signal the logic swing of which is limited by the potential of said second source terminal and the potential of said third source terminal.

18. A method of converting a level of a signal from a first logic circuit having a logic swing set to a rated voltage into the logic swing of a signal of a second logic circuit set to a level higher than that of the first standard circuit, comprising the steps of:
generating an upper limit reference voltage correlated with an upper limit of the logic swing according to said second standard, and a lower limit reference voltage correlated with a lower limit of the logic swing according to said second standard;
in response to an input signal of the first standard, generating a difference voltage corresponding to a difference between the upper limit reference voltage and the lower limit reference voltage; and, in response generating an output signal of a logic swing corresponding to the second standard logic swing.

19. A method of converting a level of a signal from a first standard logic circuit having a logic swing set to a rated voltage into the logic amplitude of a signal of a second standard logic swing set to a level higher than that of the first standard circuit, comprising the steps of:

setting a first source terminal to a potential corresponding to a lower limit logic swing of the logic circuit of said first standard, a second source terminal to a potential corresponding to an upper limit logic swing of the logic circuit of said second standard, and a third source terminal to a gourd level, deriving from said second source terminal and said third source terminal an upper limit reference voltage correlated with an upper limit of the logic swing according to said second standard, and a lower limit reference voltage correlated with a lower limit of the logic swing according to said second standard, in response to a signal from the logic circuit of said first standard, generating a difference voltage corresponding to a difference between the upper limit reference voltage and the lower limit reference voltage;

generating an output signal of a logic swing determined by the potentials of the second and third source terminals.

* * * * *